(12) United States Patent
Huang et al.

(10) Patent No.: US 8,779,545 B2
(45) Date of Patent: Jul. 15, 2014

(54) SEMICONDUCTOR STRUCTURE WITH DISPERSEDLY ARRANGED ACTIVE REGION TRENCHES

(71) Applicant: Taiwan Semiconductor Co., Ltd., Taipei (TW)

(72) Inventors: Chao-Hsin Huang, New Taipei (TW); Chih-Chiang Chuang, New Taipei (TW)

(73) Assignee: Taiwan Semiconductor Co., Ltd., Taipei (TW)

( * ) Notice: Subject to any disclaimer, the term of this patent is extended or adjusted under 35 U.S.C. 154(b) by 9 days.

(21) Appl. No.: 13/737,233

(22) Filed: Jan. 9, 2013

(65) Prior Publication Data
US 2013/0270669 A1    Oct. 17, 2013

(30) Foreign Application Priority Data
Apr. 13, 2012  (TW) .............................. 101206869 A

(51) Int. Cl.
*H01L 29/06*      (2006.01)
(52) U.S. Cl.
USPC .................................. 257/491; 257/E29.338

(58) Field of Classification Search
USPC .................................................. 257/487, 491
See application file for complete search history.

(56) References Cited

U.S. PATENT DOCUMENTS 6,855,986 B2 *   2/2005   Hsieh et al. .................... 257/339
7,989,887 B2 *   8/2011   Hsieh ............................. 257/330

* cited by examiner

*Primary Examiner* — Chandra Chaudhari
(74) *Attorney, Agent, or Firm* — Rosenberg, Klein & Lee

(57) ABSTRACT

A semiconductor structure with dispersedly arranged active region trenches is provided. The semiconductor structure comprises a semiconductor substrate, an epitaxial layer, and an active region dielectric layer. The semiconductor substrate is doped with impurities of a first conductive type having a first impurity concentration. The epitaxial layer is doped with impurities of the first conductive type having a second impurity concentration and is formed on the semiconductor substrate. The epitaxial layer has a plurality of active region trenches formed therein being arranged in a dispersed manner. The active region dielectric layer covers a bottom and a sidewall of the active region trenches. Wherein, the active region trench has an opening in a tetragonal shape on a surface of the epitaxial layer, and the first impurity concentration is greater than the second impurity concentration.

17 Claims, 4 Drawing Sheets

SEMICONDUCTOR STRUCTURE WITH DISPERSEDLY ARRANGED ACTIVE REGION TRENCHES

FIELD OF THE INVENTION

The present invention relates to a semiconductor structure with dispersedly arranged active region trenches, and more particularly relates to a semiconductor structure with active region trenches arranged in the epitaxial layer in a dispersed manner.

BACKGROUND OF THE INVENTION

For a long time, schottky diode has been an important power device featuring a metal-semiconductor junction to create a schottky barrier so as to provide the function of rectification. With the characteristics of high switching speed and rectification, the schottky diode has been widely applied to high speed switching power devices, digital computers, and output regulators However, the present schottky diodes fabricated by using semiconductor structures has the disadvantages of low reverse breakdown voltage and large reverse leakage current. In addition, the reverse current increases with increasing temperature to result in the problem of thermal instability. Thus, schottky diode should be operated under the reverse bias much smaller than the rated value, which brings some additional limitations to the application of schottky diode.

In view of the above mentioned problem, various improvements of semiconductor structures have been developed to enhance reverse breakdown voltage and reduce leakage current, and a commonly-used improvement is to form a boron-implanted termination (BIT). The termination region is capable to moderate the electric field generated at the edge of active region under reverse bias so as to enhance reverse breakdown voltage and reduce leakage current. However, under forward bias, the output current of the semiconductor device would be restricted by the arrangement of trenches. Sometimes, a greater forward bias voltage is demanded for such semiconductor device to achieve a desired output current value, which badly influences the application thereof.

Please refer to FIG. 1, which shows a schematic view of a conventional arrangement of the active region trenches. As shown, the semiconductor structure 1 has a plurality of active region trenches 11 and an epitaxial layer 12. The active region trenches 11 has an active region dielectric layer 111 and a polysilicon layer 112 located therein, and the active region trenches 11 are of continuous stripe-shaped structures regularly arranged in the epitaxial layer 12. However, such continuous stripe-shaped structure restricts the effective usage of epitaxial layer 12 surface area and limits the output current under forward bias. Thus, in order to achieve a desired current output, a higher forward bias voltage or a larger chip size should be used, wherein the later is the method being used in the present practice to increase output current. However, neither of these methods has industrial economic efficiency.

Accordingly, it is believed that the people skilled in the art would notice that the conventional semiconductor structure has the disadvantage of low current output under forward bias, which usually needs a higher forward bias voltage to achieve the desired current output. Thus, the problem of insufficient rated output current value does exists in the conventional art.

BRIEF SUMMARY OF INVENTION

The technical problem to be resolved and the object of the present invention:

Because the conventional semiconductor structure has the disadvantage of low current output under forward bias and usually needs a higher forward bias voltage to achieve the desired current output, thus, there exists the problem of insufficient rated output current value in the prior art.

Accordingly, a major object of the present invention is to provide a semiconductor structure with dispersedly arranged active region trenches, which has a plurality of active region trenches formed in the epitaxial layer and these active region trenches are arranged in a dispersed manner.

The technical feature of the present invention for solving the problem:

In order to solve the problem of prior art, a semiconductor structure with dispersedly arranged active region trenches is provided in accordance with a preferred embodiment of the present invention. The semiconductor structure with dispersedly arranged active region trenches comprises a semiconductor substrate, an epitaxial layer, and an active region dielectric layer. The semiconductor substrate is doped with impurities of a first conductive type having a first impurity concentration. The epitaxial layer is doped with impurities of the first conductive type having a second impurity concentration and formed on the semiconductor substrate. In addition, the epitaxial layer has a plurality of active region trenches formed therein. These active region trenches are arranged in the epitaxial layer in a dispersed manner. The active region dielectric layer covers a bottom and a sidewall of the active region trenches. Wherein, the active region trench has an opening in a tetragonal shape on a surface of the epitaxial layer, and the first impurity concentration is greater than the second impurity concentration.

As a preferred embodiment, within the semiconductor structure with dispersedly arranged active region trenches, the tetragonal shape is a square or a rectangle, a side of the square is ranged between 0.6 μm and 1.5 μm, a length of the rectangle is ranged between 3 μm and 8 μm, and a width of the rectangle is ranged between 0.6 μm and 1.5 μm. In addition, when the tetragonal shape is a square, an interval between central points of the active region trenches is ranged between 3 μm and 5 μm. When the tetragonal shape is a rectangle, an interval between length sides of the active region trenches is ranged between 1.5 μm and 5 μm, and an interval between width sides thereof is ranged between 1.5 μm and 5 μm.

Moreover, as a preferred embodiment, the semiconductor structure with dispersedly arranged active region trenches further comprises an ion implantation layer, which is formed in the active region trenches by implanting impurities of a second conductive type into the bottom of the active region trenches with an ion implantation power of the impurities of the second conductive type ranged between 30 KeV and 100 KeV, an implantation angle thereof ranged between 7 and 25 degree, and an impurity concentration thereof ranged between $1e^{12}$ and $1e^{13}$.

As a preferred embodiment, the semiconductor structure with dispersedly arranged active region trenches further comprises a polysilicon layer covering the active region dielectric layer and filling the active region trenches. In addition, as a preferred embodiment, a thickness of the active region dielectric layer is ranged between 1000 Å and 3000 Å, the active region dielectric layer may be a thermal oxide layer formed of $SiO_2$.

As a preferred embodiment, the semiconductor structure with dispersedly arranged active region trenches further comprises at least a termination region trench, which is formed in the epitaxial layer and away from the active region trenches. The termination region trench has a depth greater than that of the active region trenches and close to a depth of a depletion region under reverse breakdown. As a preferred embodiment, an interval of the termination region trench and the closest active region trench is ranged between 0.5 µm and 4 µm, a width of the termination region trench is ranged between 3 µm and 10 µm, a depth of the termination region trench is ranged between 5 µm and 12 µm, a width of the active region trenches is ranged between 0.6 µm and 1.5 µm, and a depth of the active region trenches is ranged between 1.5 µm and 3 µm.

In addition, as a preferred embodiment, the semiconductor structure with dispersedly arranged active region trenches further comprises a termination region dielectric layer lining the termination region trench. The termination dielectric layer comprises a Tetraethoxysilane (TEOS) layer and a Boron Phosphorous Silicate Glass (BPSG) layer. A thickness of the TEOS layer is ranged between 1000 Å and 3000 Å, and a thickness of the BPSG layer is ranged between 4000 Å and 7000 Å.

The improvement of the present invention in compared with the prior art:

Since the conventional semiconductor structure has the disadvantage of low current output under forward bias and usually needs a higher forward bias voltage to achieve the desired current output, there exists the problem of insufficient rated output current value in the prior art.

Accordingly, a major object of the present invention is to provide a semiconductor structure with dispersedly arranged active region trenches, which has a plurality of active region trenches formed in the epitaxial layer and these active region trenches are arranged in a dispersed manner. Such structure is capable to increase the exposed surface area of the epitaxial layer such that a desired current output might be generated by using a smaller forward bias voltage.

The embodiments adopted in the present invention would be further discussed by using the flowing paragraph and the figures for a better understanding.

DETAILED DESCRIPTION OF THE INVENTION

There are various embodiments of the composite regeneration membrane in accordance with the present invention, which are not repeated hereby. The preferred embodiment is mentioned in the following paragraph as an example. It should be understood by those skilled in the art that the preferred embodiments disclosed in the following paragraph are merely an example instead of restricting the scope of the invention itself.

Figure 1:
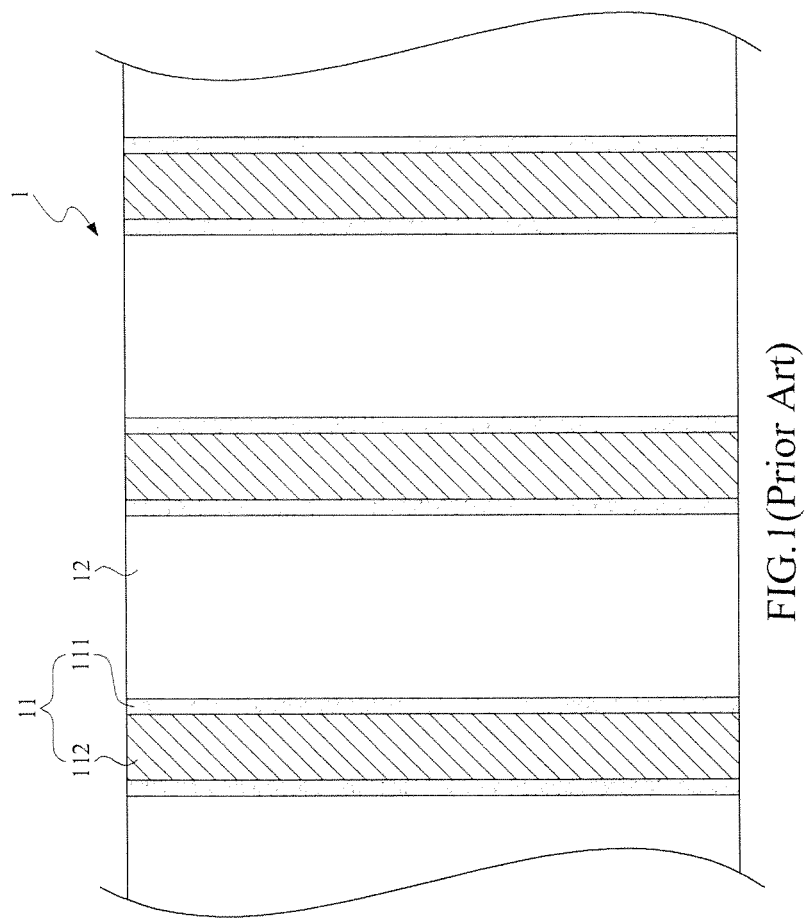
FIG. 1 is a schematic view showing a conventional arrangement of the active region trenches.
Figure 2:
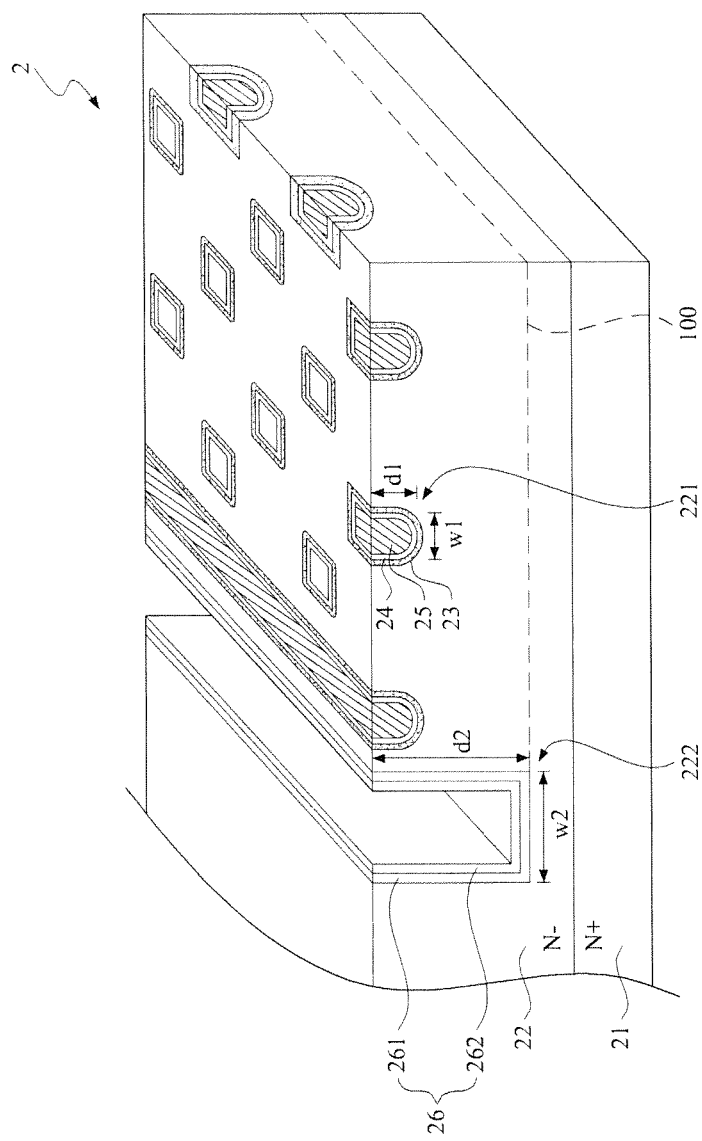
FIG. 2 is a schematic view of a semiconductor device with dispersed arranged active region trenches in accordance with a first embodiment of the present invention.
Figure 3:
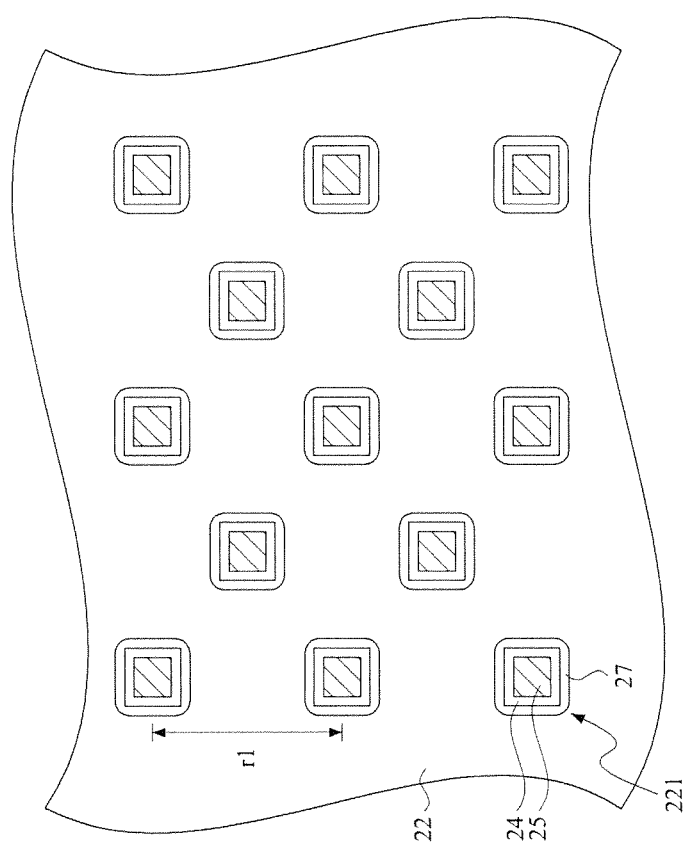
FIG. 3 is a schematic view of an arrangement of the active region trenches in accordance with the first embodiment of the present invention.

Please refer to both FIG. 2 and FIG. 3, wherein FIG. 2 is a schematic view of a semiconductor structure with dispersedly arranged active region trenches in accordance with a first embodiment of the present invention, and FIG. 3 is a schematic view showing the arrangement of the active region trenches of the first embodiment of the present invention. As show in FIG. 2 and FIG. 3, the semiconductor structure 2 comprises a semiconductor substrate 21, an epitaxial layer 22, an ion implantation layer 23, an active region dielectric layer 24, a polysilicon layer 25, and a termination region dielectric layer 26.

The semiconductor substrate 21 is doped with impurities of a first conductive type having a first impurity concentration. The epitaxial layer 22 is formed on the semiconductor substrate 21 and is doped with impurities of the first conductive type having a second impurity concentration, wherein the first impurity concentration is greater than the second impurity concentration. Thus, the first impurity concentration is labeled N+ and the second impurity concentration is labeled N− in the figures.

The epitaxial layer 22 has a plurality of active region trenches 221 and a termination region trench 222 formed therein. These active region trenches 221 are arranged in the epitaxial layer 22 in a dispersed manner, and the termination region trench 222 is away from the active region trenches 221. In addition, a depth d1 of the active region trenches 221 is smaller than a depth d2 of the termination region trenches, and the depth d2 is close to a depth of the depletion region under reverse breakdown, which is the level of the depletion region curve 100 in this figure. As a preferred embodiment, an interval between the termination region trench 222 and the closest one of the active region trenches 221 is ranged between 0.5 µm and 4 µm. In addition, a width w1 of the active region trenches 221 is ranged between 0.6 µm and 1.5 µm, the depth d1 of the active region trenches 221 is ranged between 1.5 µm and 3 µm, a width w2 of the termination region trench 222 is ranged between 3 µm and 10 µm, and the depth d2 of the termination region trench 222 is ranged between 5 µm and 12 µm.

In addition, the active region trench 221 has an opening in a tetragonal shape on a surface of the epitaxial layer 22. The tetragonal shape is a square. As a preferred embodiment, a side of the square is ranged between 0.6 µm and 1.5 µm. In addition, when the tetragonal shape is a square, an interval r1 between central points of the active region trenches 221 is ranged between 3 µm and 5 µm.

The ion implantation layer 23 is formed in the active region trenches 221 by implanting impurities of a second conductive type into the bottom of the active region trenches 221 with an ion implantation power of the impurities of the second conductive type ranged between 30 KeV and 100 KeV, an implantation angle thereof ranged between 7 and 25 degree, and an impurity concentration thereof ranged between $1e^{12}$ and $1e^{13}$.

The active region dielectric layer 24 covers a bottom and a sidewall of the active region trenches 221. The active region dielectric layer 24 may be a thermal oxide layer with a thickness ranged between 1000 Å and 3000 Å. The thermal oxide layer may be formed of silicon dioxide ($SiO_2$).

The polysilicon layer 25 covers the active region dielectric layer 24 and fills the active region trenches 221. The termination region dielectric layer 226 lines the termination region trench 222. In addition, the termination dielectric layer 226 comprises a Tetraethoxysilane (TEOS) layer 261 and a Boron Phosphorous Silicate Glass (BPSG) layer 262. A thickness of the TEOS layer 261 is ranged between 1000 Å and 3000 Å, and a thickness of the BPSG layer 262 is ranged between 4000 Å and 7000 Å.

Please refer to FIG. 3, although the active region trenches 221 have an opening in a square shape, and the ion implantation layer 23 would be turned into a circular-shaped ion implantation region 27 in the epitaxial layer 22 after the thermal process.

Figure 4:
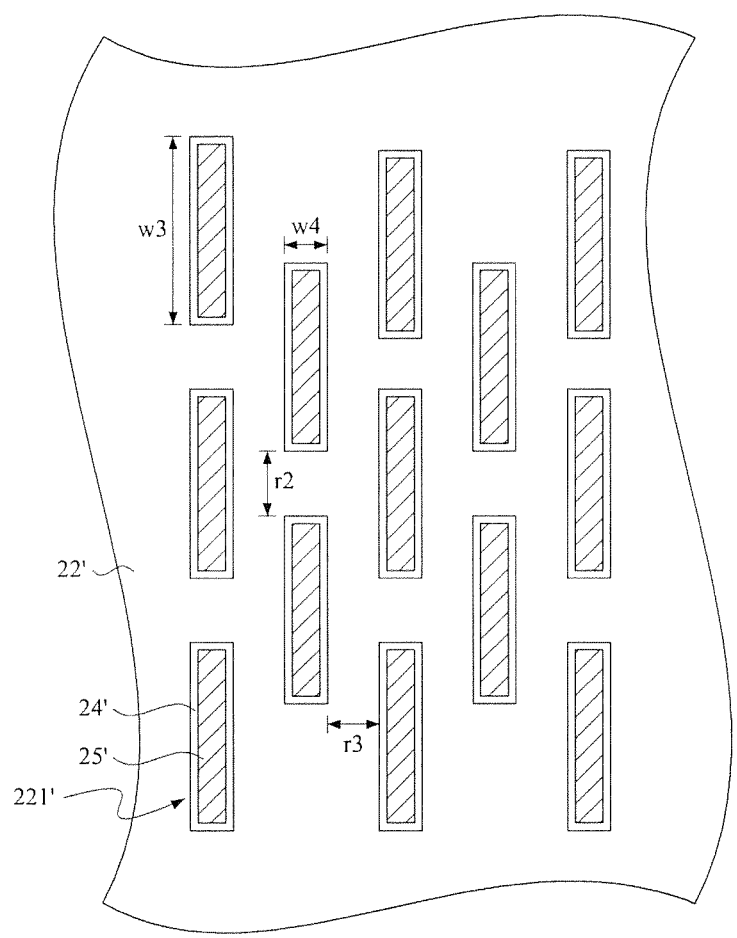
FIG. 4 is a schematic view of an arrangement of the active region trenches in accordance with a second embodiment of the present invention.

Please refer to FIG. 4, which shows a schematic view of the arrangement of the active region trenches in accordance with a second embodiment of the present invention. As shown, these active region trenches 221' are filled with the active region dielectric layer 24' and the polysilicon layer 25', and the opening of the active region trench 221' on the surface of the epitaxial layer 22' shows a rectangular shape and these openings are arranged in an array. The interval r2 between the width sides of the active region trenches 221' is ranged between 1.5 μm and 5 μm, the interval r3 between the length sides of the active region trenches 221' is ranged between 1.5 μm and 5 μm, and the length of the rectangular shape is ranged between 3 μm and 8 μm, and the width thereof is ranged between 0.6 μm and 1.5 μm.

In conclusion, with the feature of dispersedly arranged active region trenches in the epitaxial layer arranged, the exposed surface area of the epitaxial layer can be enhanced such that the semiconductor structure with dispersedly arranged active region trenches provided in the present invention is capable to generate the desired current output by using a smaller forward bias voltage. It is believed that such semiconductor structure should be able to fulfill the industrial usage.

The detail description of the aforementioned preferred embodiments is for clarifying the feature and the spirit of the present invention. The present invention should not be limited by any of the exemplary embodiments described herein, but should be defined only in accordance with the following claims and their equivalents. Specifically, those skilled in the art should appreciate that they can readily use the disclosed conception and specific embodiments as a basis for designing or modifying other structures for carrying out the same purposes of the present invention without departing from the scope of the invention as defined by the appended claims.

What is claimed is:

1. A semiconductor structure with dispersedly arranged active region trenches, comprising:
    a semiconductor substrate doped with impurities of a first conductive type having a first impurity concentration;
    an epitaxial layer doped with impurities of the first conductive type having a second impurity concentration, formed on the semiconductor substrate, and having a plurality of active region trenches arranged in the epitaxial layer in a dispersed manner; and
    an active region dielectric layer, covering a bottom and a sidewall of the active region trenches;
    wherein, the active region trench has an opening in a tetragonal shape on a surface of the epitaxial layer, and the first impurity concentration is greater than the second impurity concentration.

2. The semiconductor structure with dispersedly arranged active region trenches of claim 1, wherein the tetragonal shape is a square or a rectangle, a side of the square is ranged between 0.6 μm and 1.5 μm, a length of the rectangle is ranged between 3 μm and 8 μm, and a width of the rectangle is ranged between 0.6 μm and 1.5 μm.

3. The semiconductor structure with dispersedly arranged active region trenches of claim 2, wherein when the tetragonal shape is a square, an interval between central points of the active region trenches is ranged between 3 μm and 5 μm.

4. The semiconductor structure with dispersedly arranged active region trenches of claim 2, wherein when the tetragonal shape is a rectangle, an interval between length sides of the active region trenches is ranged between 1.5 μm and 5 μm, and an interval between width sides thereof is ranged between 1.5 μm and 5 μm.

5. The semiconductor structure with dispersedly arranged active region trenches of claim 1, further comprising an ion implantation layer formed in the active region trenches by implanting impurities of a second conductive type into the bottom of the active region trenches.

6. The semiconductor structure with dispersedly arranged active region trenches of claim 5, wherein an ion implantation power of the impurities of the second conductive type is ranged between 30 KeV and 100 KeV, an implantation angle thereof is ranged between 7 and 25 degree, and an impurity concentration thereof is ranged between $1e^{12}$ and $1e^{13}$.

7. The semiconductor structure with dispersedly arranged active region trenches of claim 1, further comprising a polysilicon layer, covering the active region dielectric layer and filling the active region trenches.

8. The semiconductor structure with dispersedly arranged active region trenches of claim 1, wherein a thickness of the active region dielectric layer is ranged between 1000 Å and 3000 Å.

9. The semiconductor structure with dispersedly arranged active region trenches of claim 1, wherein the active region dielectric layer is a thermal oxide layer.

10. The semiconductor structure with dispersedly arranged active region trenches of claim 9, wherein the thermal oxide layer is formed of silicon dioxide ($SiO_2$).

11. The semiconductor structure with dispersedly arranged active region trenches of claim 1, further comprising at least a termination region trench, formed in the epitaxial layer and away from the active region trenches, and having a depth greater than that of the active region trenches.

12. The semiconductor structure with dispersedly arranged active region trenches of claim 11, wherein an interval of the termination region trench and the closest active region trench is ranged between 0.5 μm and 4 μm.

13. The semiconductor structure with dispersedly arranged active region trenches of claim 11, wherein a width of the termination region trench is ranged between 3 μm and 10 μm, and a depth thereof is ranged between 5 μm and 12 μm.

14. The semiconductor structure with dispersedly arranged active region trenches of claim 11, further comprising a termination region dielectric layer, lining the termination region trench.

15. The semiconductor structure with dispersedly arranged active region trenches of claim 14, wherein the termination dielectric layer comprises a Tetraethoxysilane (TEOS) layer and a Boron Phosphorous Silicate Glass (BPSG) layer.

16. The semiconductor structure with dispersedly arranged active region trenches of claim 15, wherein a thickness of the TEOS layer is ranged between 1000 Å and 3000 Å, and a thickness of the BPSG layer is ranged between 4000 Å and 7000 Å.

17. The semiconductor structure with dispersedly arranged active region trenches of claim 1, wherein a width of the active region trenches is ranged between 0.6 μm and 1.5 μm, and a depth thereof is ranged between 1.5 μm and 3 μm.

* * * * *